US011009758B2

(12) United States Patent
Chikama et al.

(10) Patent No.: US 11,009,758 B2
(45) Date of Patent: May 18, 2021

(54) DISPLAY PANEL AND DISPLAY DEVICE

(71) Applicant: Sharp Kabushiki Kaisha, Sakai (JP)

(72) Inventors: Yoshimasa Chikama, Sakai (JP); Jun Nishimura, Sakai (JP); Yoshiharu Hirata, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 107 days.

(21) Appl. No.: 15/929,135

(22) Filed: Jun. 4, 2019

(65) Prior Publication Data

US 2019/0377210 A1 Dec. 12, 2019

Related U.S. Application Data

(60) Provisional application No. 62/683,686, filed on Jun. 12, 2018.

(51) Int. Cl.
*G02F 1/1368* (2006.01)
*G02F 1/1335* (2006.01)
*H01L 27/12* (2006.01)
*G09G 3/36* (2006.01)

(52) U.S. Cl.
CPC ...... *G02F 1/1368* (2013.01); *G02F 1/133512* (2013.01); *G02F 1/133514* (2013.01); *H01L 27/1225* (2013.01); *G02F 2202/10* (2013.01); *G09G 3/3648* (2013.01); *G09G 3/3674* (2013.01)

(58) Field of Classification Search
CPC ............ G02F 1/136209; G02F 1/1368; G02F 2202/10; G09G 2320/00; G09G 2320/02; H01L 27/1225
See application file for complete search history.

(56) References Cited

U.S. PATENT DOCUMENTS

| 10,243,010 | B2* | 3/2019 | Imai ................... G02F 1/13338 |
|---|---|---|---|
| 2003/0227433 | A1 | 12/2003 | Moon |
| 2006/0256066 | A1 | 11/2006 | Moon |
| 2008/0017885 | A1* | 1/2008 | Ishii ..................... H01L 27/124 |
| | | | 257/203 |
| 2011/0001747 | A1 | 1/2011 | Shimizu et al. |
| 2014/0022479 | A1* | 1/2014 | Hosaka ............ G02F 1/133512 |
| | | | 349/43 |
| 2014/0125712 | A1 | 5/2014 | Shimizu et al. |

(Continued)

FOREIGN PATENT DOCUMENTS

| JP | 2004-157508 A | 6/2004 |
|---|---|---|
| JP | 2009-42664 A | 2/2009 |

(Continued)

*Primary Examiner* — Michael H Caley
*Assistant Examiner* — Jonathan Y Jung
(74) *Attorney, Agent, or Firm* — Keating & Bennett, LLP

(57) ABSTRACT

A display panel displaying an image includes a first substrate, a second substrate disposed opposite the first substrate, electric optical substance sealed between the first substrate and the second substrate, a transistor disposed on the first substrate and supplying an electric signal to the electric optical substance and including an oxide semiconductor film as an activating layer, and a light blocking film disposed on the second substrate and blocking visible light from transmitting therethrough, the light blocking film having a hole in a position overlapping the transistor in a plan view.

8 Claims, 7 Drawing Sheets

(56) References Cited

U.S. PATENT DOCUMENTS

| | | | |
|---|---|---|---|
| 2014/0198275 A1* | 7/2014 | Nishida | G09G 3/3655 |
| | | | 349/41 |
| 2016/0147099 A1 | 5/2016 | Hosaka et al. | |
| 2017/0082887 A1* | 3/2017 | Kubota | H01L 27/3232 |
| 2018/0143473 A1 | 5/2018 | Yamazaki et al. | |
| 2018/0261628 A1* | 9/2018 | Imai | G06F 3/0412 |
| 2019/0064566 A1 | 2/2019 | Hosaka et al. | |
| 2020/0142230 A1 | 5/2020 | Hosaka et al. | |

FOREIGN PATENT DOCUMENTS

| | | |
|---|---|---|
| JP | 4946424 B2 | 6/2012 |
| JP | 2014-038323 A | 2/2014 |
| JP | 2018-087969 A | 6/2018 |

\* cited by examiner

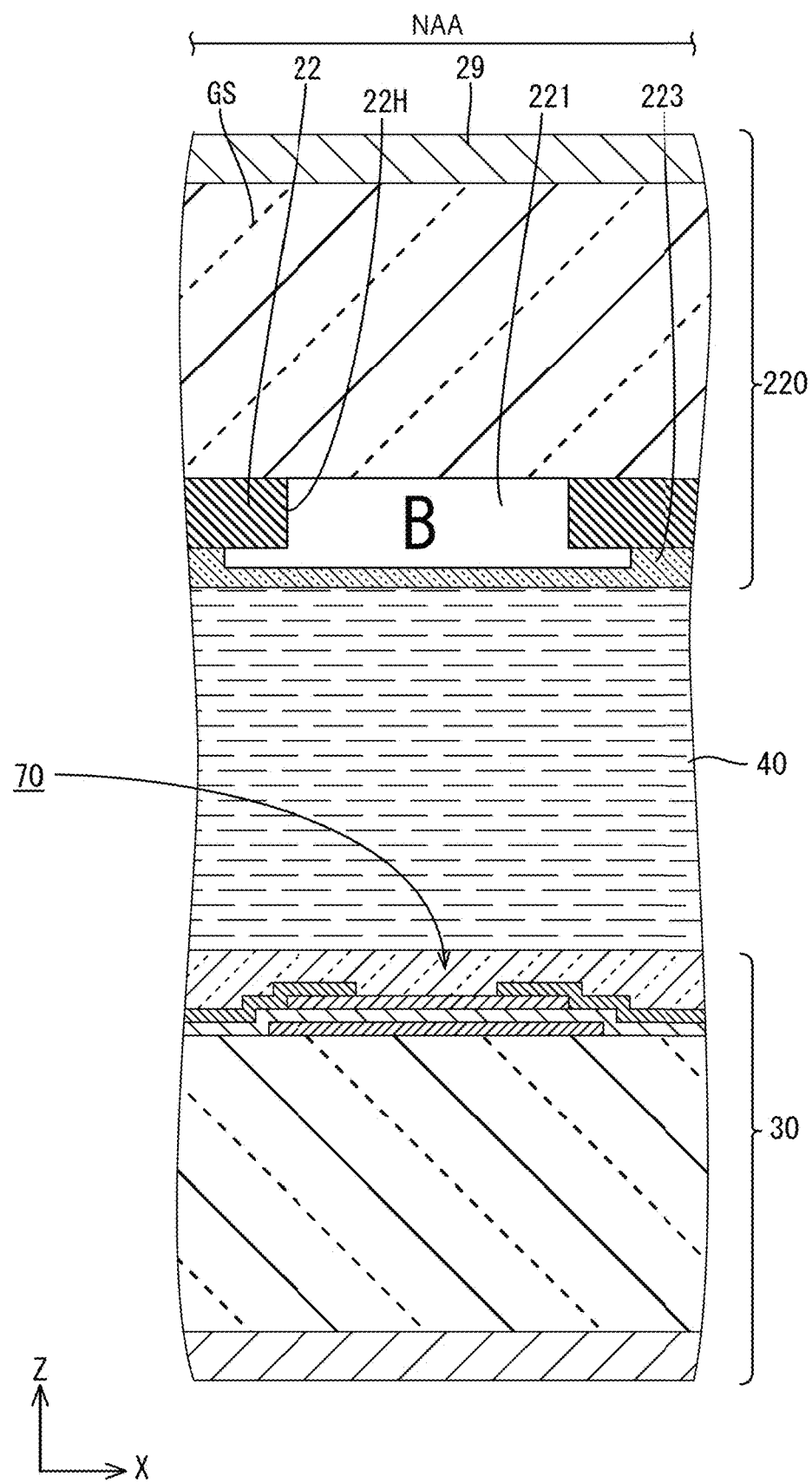

DISPLAY PANEL AND DISPLAY DEVICE

CROSS REFERENCE TO RELATED APPLICATION

This application claims priority from U.S. Provisional Application No. 62/683,686 filed on Jun. 12, 2018. The entire contents of the priority application are incorporated herein by reference.

TECHNICAL FIELD

The technology disclosed in this specification relates to a display panel and a display device.

BACKGROUND ART

A display panel including a pair of substrates that are opposite each other and an electric optical substance that is sealed therebetween has been known. Such a display panel displays an image by supplying electric signals to the electric optical substance. Such a display panel includes thin film transistors (TFTs) as switching components for supplying electric signals to the electric optical substance and controlling operations of each pixel. There has been a proposal of using an oxide semiconductor film as an activating layer for the TFTs instead of a silicon semiconductor film such as amorphous silicon.

The oxide semiconductor film has high electron mobility and an uniform property compared to the silicon semiconductor film; however, the electric characteristics thereof may be changed by electric stress such as application of voltage. If a threshold value of the TFT is increased according to the change of the electric characteristics and the electric optical substance may not be supplied with the electric signals properly, errors such as a lighting error may be caused. Patent Document 1 proposes a method of applying an electric stress between a gate terminal and a source terminal when the TFT is not driven such that the electric characteristics are less likely to be affected by the electric stress during use of the TFT.

A conventional display panel includes a light blocking film that is disposed between the pixels that are used for displaying an image in the display area where images are displayed. Generally, the light blocking film is disposed to overlap the gate line and the source line in a plan view and cover a front surface side of a display area TFT that is arranged at an intersection of the lines. A non-display area TFT may be arranged in a non-display area where no image is displayed. The non-display area including a section having the non-display area TFT is normally covered with the light blocking film to restrict leaking of light and increase a contrast of a displayed image. For example, Patent Document 2 discloses a liquid crystal panel having a hole in the light blocking film in the display area. The hole is formed to provide light to a sensor diode included in each pixel through a film having wavelength selectivity and the hole is not configured such that the light is provided to the TFT.

RELATED ART DOCUMENT

Patent Document

[Patent Document 1] Japanese Unexamined Patent Application Publication No. 2009-42664

[Patent Document 2] Japanese Examined Patent Application Publication No. 4946424

SUMMARY

In Patent Document 1, the electric characteristics of the TFT are less likely to be changed; however, the electric stress needs to be applied to the TFT by applying voltage unnecessary for driving to the TFT. In a conventional display panel including the liquid crystal panel of Patent Document 2, the light blocking film is arranged on a section thereof overlapping the TFTs in a plan view and the TFTs are less likely to receive light. The inventors focused on the electric characteristics that are changed by absorption of light by the TFT (increase in the shift amount in a minus direction) and as a result of enthusiastic study, the inventors found that the TFTs that are driven in a certain method are configured to receive the light and accordingly, the electric characteristics are less likely to be changed. This leads to the present invention.

The present technology was completed in view of the above circumstances. An object is to restrict change of electric characteristics of a TFT including an oxide semiconductor film.

One aspect of the technology described in this specification is a display panel displaying an image and the display panel includes a first substrate; a second substrate disposed opposite the first substrate; electric optical substance sealed between the first substrate and the second substrate; a transistor disposed on the first substrate and supplying an electric signal to the electric optical substance and including an oxide semiconductor film as an activating layer; and a light blocking film disposed on the second substrate and blocking visible light from transmitting therethrough, the light blocking film having a hole in a position overlapping the transistor in a plan view.

In the TFT including the oxide semiconductor film as the activating layer, the electric characteristics are also changed by the absorption of light in addition to the electric stress. According to the above configuration, the electric stress is applied to the TFT so as to change the electric characteristics in a direction reverse to the change caused by the absorption of light and light is supplied to such a TFT having the hole in the light blocking film. This may cancel the change caused by the electric stress and the electric characteristics are less likely to be changed as a whole. As a result, the property of the TFT is stabilized and the display panel having less occurrence of display errors is obtained.

The electric optical substance may be substance whose optical characteristics such as transmittance or brightness may be changed by supply of electric signals (a current signal or a voltage signal), and examples of the electric optical substance may include liquid crystals or organic ELs.

According to the present technology, an operation of a display panel is stabilized by restricting change of the electric characteristics of a transistor and a display panel and a display device that reduce occurrence of display errors are obtained.

BRIEF DESCRIPTION OF THE DRAWINGS

FIG. 7 is a schematic cross-sectional view illustrating a cross-sectional configuration of a liquid crystal panel in a non-display area according to a second embodiment.

DETAILED DESCRIPTION

<First Embodiment>

Figure 1:
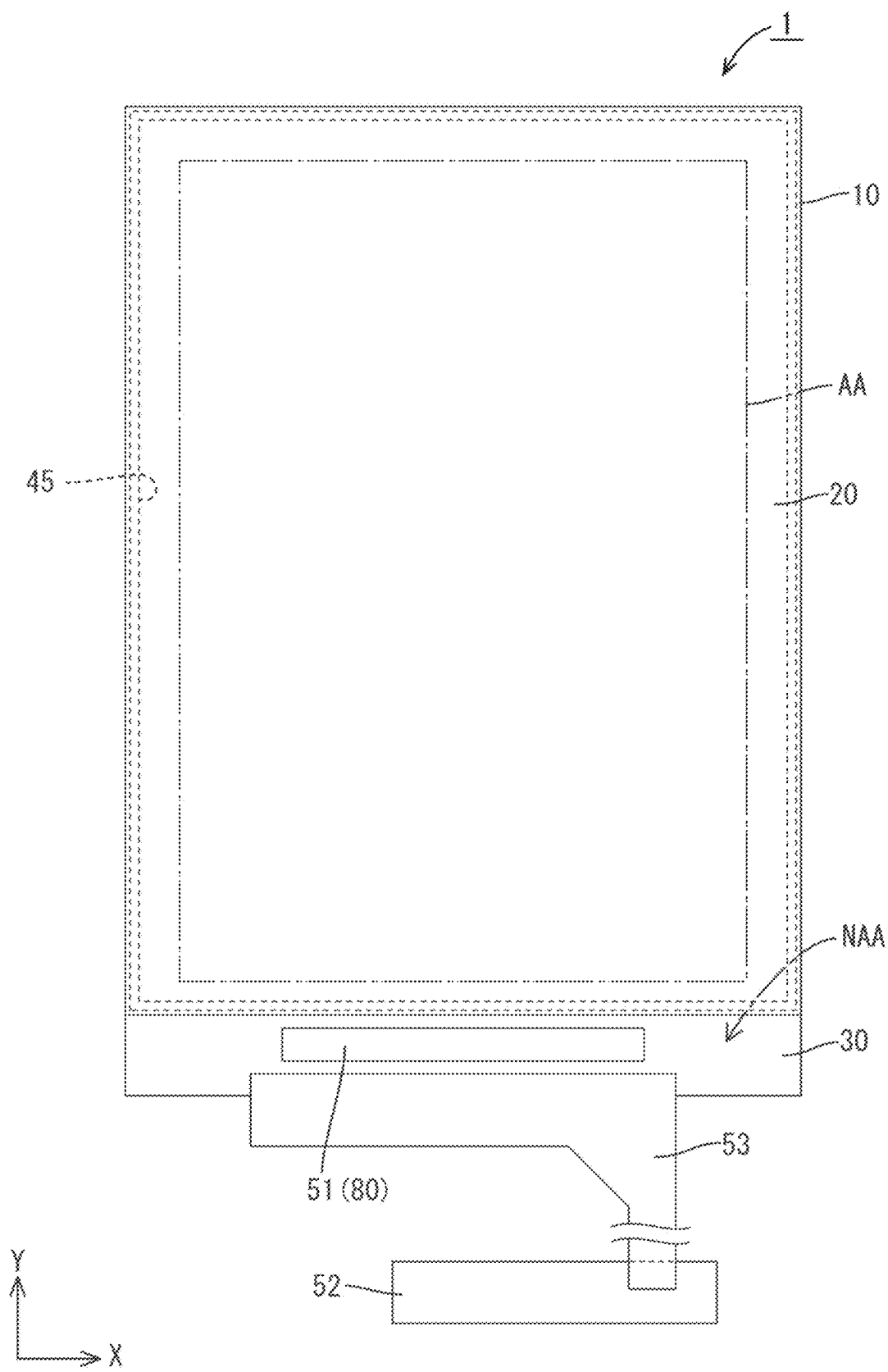
FIG. 1 is a schematic plan view illustrating a connection configuration of a liquid crystal panel of a liquid crystal display device according to a first embodiment and mounting components.

A first embodiment will be described with reference to FIGS. 1 to 6. In the present embodiment, a liquid crystal display device (an example of a display device) 1 will be described. X-axis, Y-axis and Z-axis may be indicated in the drawings. The axes in each drawing correspond to the respective axes in other drawings. An upper side in FIGS. 2 and 3 corresponds to a front side (a lower side in the drawings corresponds to a back side). Regarding same components, one of them is provided with a reference symbol and others may not be provided with the reference symbol.

A general configuration of the liquid crystal display device 1 will be described.

As illustrated in FIG. 1, the liquid crystal display device 1 includes a liquid crystal panel (an example of a display panel) 10 and a backlight unit (a lighting device) for supplying light for display is mounted on a back surface side of the liquid crystal panel 10.

The backlight unit includes a light source (such as a LED) that emits white light to the liquid crystal panel 10 and an optical member that applies an optical effect to the light from the light source and converts the light to planar light. On a front surface side of the liquid crystal panel 10, a frame member (a bezel) may be arranged to sandwich and hold an outer peripheral section (a non-display area NAA, which will be described later) of the liquid crystal panel 10.

The liquid crystal panel 10 will be described.

As illustrated in FIG. 1, the liquid crystal panel 10 has a vertically-long rectangular (quadrangular) overall shape. A long-side direction and a short-side direction of the liquid crystal panel 10 correspond to the Y-axis direction and the X-axis direction. The liquid crystal panel 10 includes a display area (an active area) AA and a non-display area (a non-active area) NAA. The display area is off centered toward one of ends of a short dimension thereof (the upper side in FIG. 1) and images are displayed in the display area AA. The non-display area NAA is formed in a frame shape (a rectangular frame shape) surrounding the display area AA and no image is displayed in the non-display area NAA. In FIG. 1, a dashed line box slightly smaller than the CF substrate 20 indicates an outline of the display area AA. An area outside the dashed line is the non-display area NAA.

Figure 2:
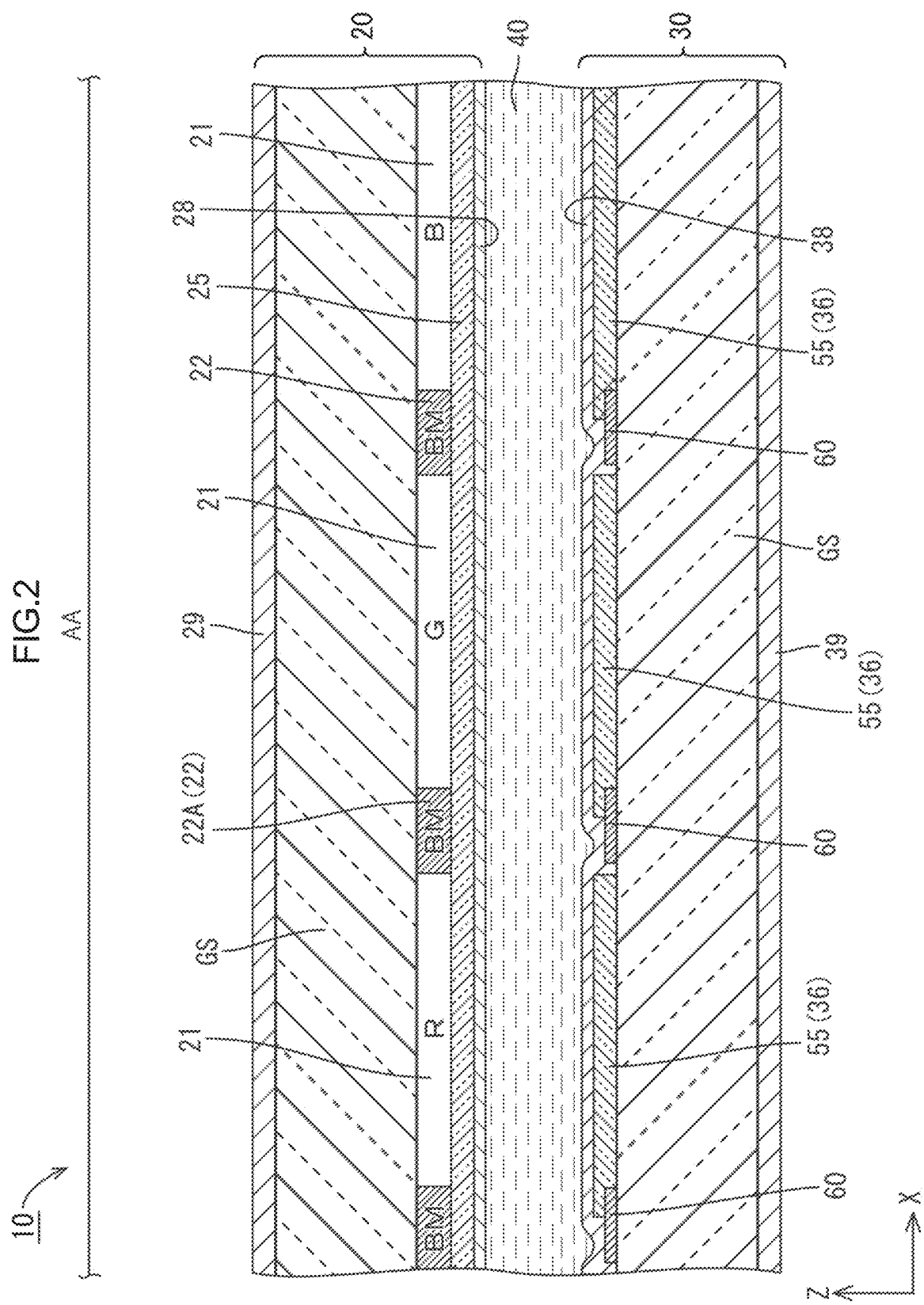
FIG. 2 is a schematic cross-sectional view illustrating a cross-sectional configuration of the liquid crystal panel in a display area.

As illustrated in FIGS. 1 and 2, the liquid crystal panel 10 includes a pair of substrates 20, 30 that are bonded to each other. One on the front side is a CF substrate (an example of a counter substrate, a second substrate) 20 and another one on the back side (a back surface side) is an array substrate (an example of an active matrix substrate, a first substrate) 30. An image is displayed on the liquid crystal panel 10 so as to be seen from a front surface or an outer plate surface of the CF substrate 20. As illustrated in FIG. 1, the array substrate 30 has a short-side dimension substantially same as that of the CF substrate 20 and has a long-side dimension greater than that of the CF substrate 20. The array substrate 30 and the CF substrate 20 are bonded together such that short-side edges (upper-side edges in FIG. 1) thereof are aligned with each other. According to such a configuration, the side edge section including another short-side edge (a lower-side edge in FIG. 1) of the array substrate 30 projects from a lower side edge of the CF substrate 20 and a projected section is a substrate non-overlapping area where the CF substrate 20 does not overlap the array substrate 30 over a certain area. As illustrated in FIG. 1, the display area AA is defined in a middle section of a substrate overlapping area and an outer peripheral edge section of the substrate overlapping area and the substrate non-overlapping area are entirely the non-display area NAA.

As illustrated in FIG. 1, in the substrate non-overlapping area of the liquid crystal panel 10, various kinds of electronic components for supplying various kinds of electric signals to drive the liquid crystal panel 10 are mounted. In the first embodiment, a driver (a panel driving section) 51 for driving the liquid crystal panel 10, a control circuit board (an external signal supply source) 52 that supplies various kinds of input signals to the driver 51 from an external device, and a flexible printed board (an external connecting component) 53 that electrically connects the liquid crystal panel 10 to the external control circuit board 52 are connected to the substrate non-overlapping area. The driver 51 includes an LSI chip including a driver circuit 80, which will be described later, therein. The driver 51 operates according to signals supplied by the control circuit board 52, which is a signal source, processes the input signals supplied by the control circuit board 52, which is a signal source, generates output signals, and sends the output signals to the display area AA of the liquid crystal panel 10.

As illustrated in FIG. 2 and other drawings, a liquid crystal layer 40 containing liquid crystal molecules, which are electric optical substance, is between the substrates 20, 30 that are arranged opposite each other and the liquid crystal layer 40 is sealed with a sealing member 45 (see FIG. 1), which will be described later. Negative type nematic liquid crystal material is used for the liquid crystal material of the liquid crystal layer 40 according to the first embodiment. The liquid crystal molecules are vertically oriented with respect to alignment films 28, 38 that are disposed on surfaces of the respective substrates 20, 30 in an initial state (non-energizing state) in which an electric field is not created between the substrates 20, 30. The alignment films 28, 38 will be described later. Namely, in the first embodiment, the liquid crystal panel 10 is operated in a VA mode.

As illustrated in FIG. 1, the sealing member 45 is between the substrates 20, 30 so as to extend over an entire periphery of the peripheral edge section of the substrate overlapping area, which is the non-display area NAA. The sealing member 45 entirely has a rectangular frame-shape (an endless loop shape) in a plan view. A gap (a cell gap) having a thickness of the liquid crystal layer 40 is kept between the outer peripheral edge sections of the substrates 20, 30.

Figure 3:
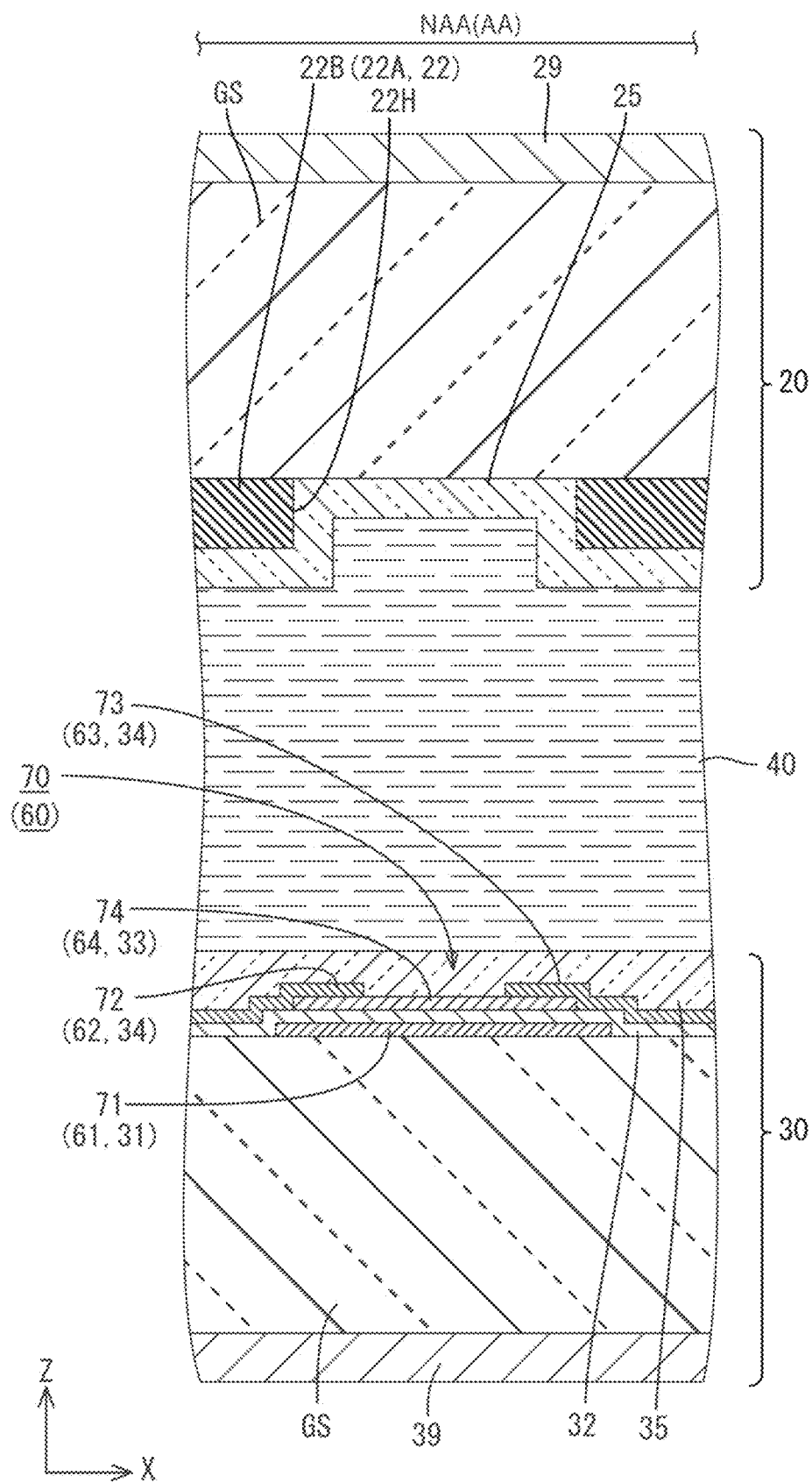
FIG. 3 is a schematic cross-sectional view illustrating a cross-sectional configuration of the liquid crystal panel near a non-display area TFT.

Next, configurations included in the array substrate 30 and the CF substrate 20 will be described with reference to FIGS. 2 to 4. In each of the drawings, each configuration is simplified and a part thereof is not illustrated. Particularly, many of the configurations are not illustrated in FIG. 2, which is a schematic cross-sectional view of the display area AA of the liquid crystal panel 10; however, a part of the configurations not illustrated in FIG. 2 is illustrated in FIG. 3, which is an enlarged cross-sectional view of a part of the non-display area NAA of the liquid crystal panel 10.

As illustrated in FIG. 2 and other drawings, each of the CF substrate 20 and the array substrate 30 includes a transparent glass substrate GS that is made of alkali-free glass or quarts glass and films that are stacked on each glass substrate GS with a known photolithography method. Polarizing plate 29, 39 are bonded on outermost surfaces of the substrates 20, 30, respectively.

As illustrated in FIG. 2, the alignment films 28, 38 are disposed on the substrates 20, 30 in the display area AA and closest to the liquid crystal layer 40. The liquid crystal material (liquid crystal molecules LC) of the liquid crystal layer 40 is aligned by the alignment films 28, 38. The alignment films 28, 38 are made of polyimide and are optical alignment films that align the liquid crystal molecules along a light irradiation direction of light according to irradiation of light having a specific wavelength region (for example, ultraviolet rays). The liquid crystal panel 10 of the first embodiment is operated in the VA mode as described before and includes a vertical alignment film that aligns the liquid crystal molecules such that long axes thereof are parallel to a normal direction with respect to the substrate. Each of the alignment films 28, 38 is disposed in a solid manner over an entire area of at least the display area AA of each substrate 20, 30.

A configuration of the array substrate 30 will be described.

As illustrated in FIG. 3, on an inner surface (a liquid crystal layer 40 side, an opposite surface side opposite the CF substrate 20) of the array board 30, the following films are formed in the following sequence from the lowest layer (the glass substrate GS side): a first metal film (a gate metal film) 31, a gate insulation film 32, an oxide semiconductor film 33, a second metal film (a source metal film) 34, an interlayer insulation film, an organic insulation film 35, a transparent electrode film 36 (see FIG. 2), and other films are formed in layers. The films included in the array substrate 30 are not limited to the above ones but may further include other interlayer insulation films and protection films as appropriate in addition to the above films.

Among the above films, the transparent electrode film 36 illustrated in FIG. 2 is disposed on only in the display area AA of the array substrate 30 and not disposed in the non-display area NAA. The insulation films including the gate insulation film 32 and the organic insulation film 35 are formed in a solid pattern (having a hole in a part thereof) over a substantially entire area of the array substrate 30. The first metal film 31, the oxide semiconductor film 33 and the second metal film 34 are disposed in a certain pattern both in the display area AA and the non-display area NAA of the array substrate 30.

Each of the first metal film 31 and the second metal film 34 is a single layer film of selected one of metal material such as copper, titanium, molybdenum and tungsten or a multilayer film including multiple layers of multiple kinds of the metal material or an alloy of multiple kinds of the metal material. The first metal film 31 mainly forms gate lines 58, which will be described later, a second gate electrode 61 of the display area TFT 60, and a first gate electrode 71 of the non-display area TFT 70. The second metal film 34 is disposed above the first metal film 31 having the gate insulation film 32 therebetween. The second metal film 34 forms source lines 59, which will be described later, a second source electrode 62 and a second drain electrode 63 of the display area TFT 60, and a first source electrode 72 and a first drain electrode 73 of the non-display area TFT 70.

The gate insulation film 32 is included at least in an upper layer than the first metal film 31. The gate insulation film 32 and the interlayer insulation film are made a silicon nitride ($SiN_x$) layer or a silicon oxide ($SiO_2$) layer.

The oxide semiconductor film 33 is disposed on the gate insulation film 32 and is an oxide thin film containing of an oxide semiconductor such as indium (In), gallium (Ga), and zinc (Zn). The oxide thin film containing indium (In), gallium (Ga), and zinc (Zn) is amorphous or crystalline and has high electron mobility. The oxide semiconductor film 33 forms a second channel section 64 of the display area TFT 60 and a first channel section 74 of the non-display area TFT 70, which will be described later.

The organic insulation film 35 is made of acrylic resin (such as polymethyl methacrylate resin (PMMA)) that is organic material and functions as a flattening film.

The transparent electrode film 36 is disposed on the organic insulation film 35 and is made of transparent electrode material such as indium tin oxide (ITO) or zinc oxide (ZnO). The transparent electrode film 36 forms a pixel electrode 55, which will be described later.

As illustrated in FIG. 2, the display area TFTs (one example of a second transistor) 60, which are switching components, and the pixel electrodes 55 are formed with the above various films in a matrix on the inner surface side of the array substrate 30 in the display area AA. As illustrated in FIG. 4, the source lines (column control lines, data lines, lines) 59 and the gate lines (row control lines, scan lines) 58 are arranged to surround the display area TFTs 60 and the pixel electrodes 55. Namely, the display area TFTs 60 and the pixel electrodes 55 are arranged at the respective intersections of the source lines 59 and the gate lines 58 and arranged in a grid in a row direction (a Y-axis direction) and a column direction (an X-axis direction).

Figure 4:
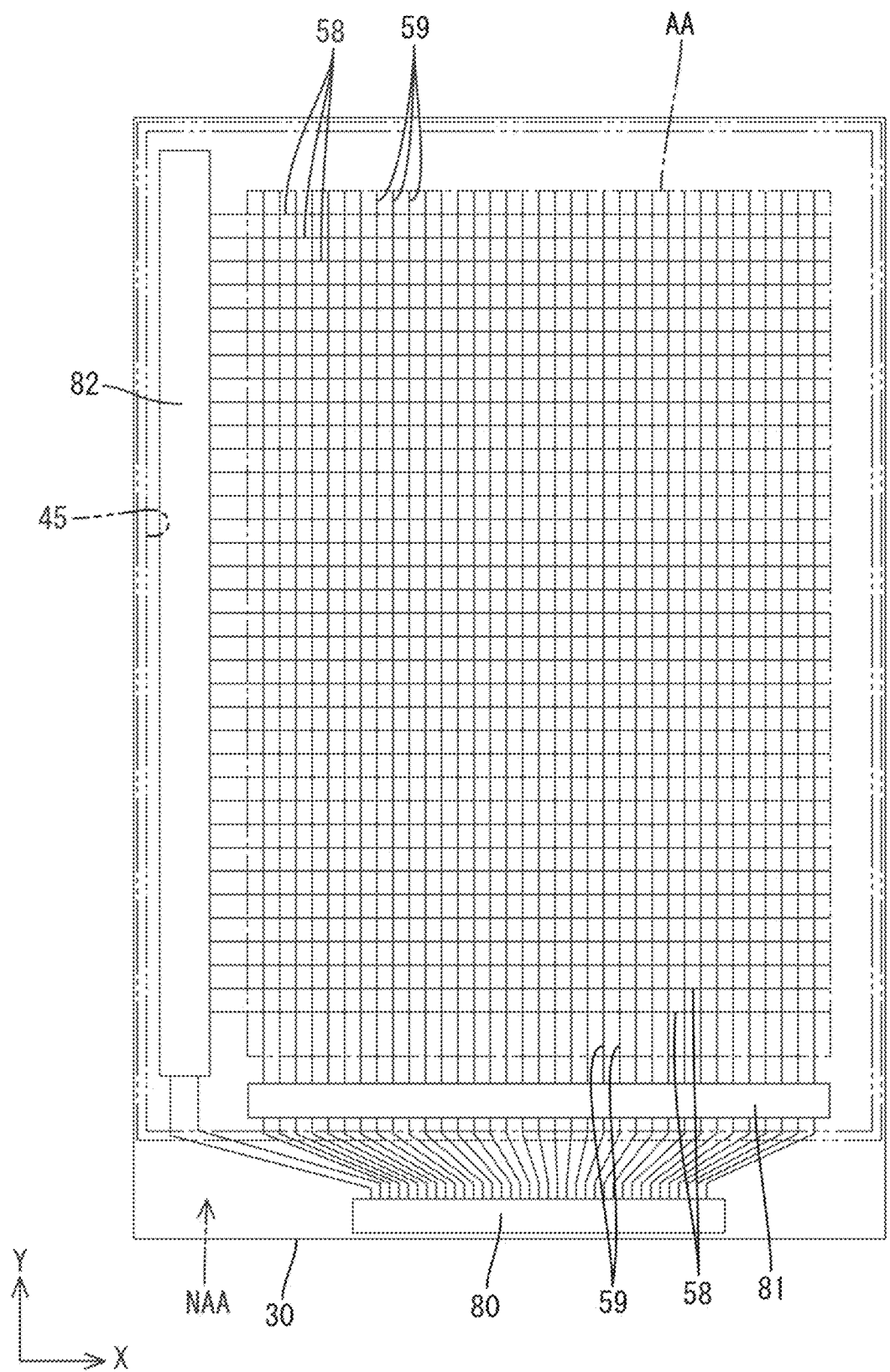
FIG. 4 is a schematic plan view illustrating a wiring structure of an array substrate of the liquid crystal panel.

As illustrated in FIG. 4, the gate lines 58 are formed from the first metal film 31 and extend in the X-axis direction and are arranged at intervals in the Y-axis direction. The source lines 59 are formed from the second metal film 34 and extend in the Y-axis direction and are arranged at intervals in the X-axis direction. A capacitance line that extends along the gate lines 58 and crosses the pixel electrode 55 may be disposed on the array substrate 30.

The display area TFT 60 has a known configuration including the oxide semiconductor film 33 as an activating layer and includes a same configuration as that of the non-display area TFT 70 illustrated in FIG. 3. Since the display area TFT 60 has the same configuration as that of the non-display area TFT 70 in the first embodiment, symbols for the configurations of the display area TFT 60 are also illustrated for the configurations of the non-display area TFT 70 in FIG. 3. The display area TFT 60 includes the second gate electrode 61 made from the first metal film 31, the oxide semiconductor film 33, the second source electrode 62, and the second drain electrode 63. The oxide semiconductor film 33 is disposed above and overlaps the second gate electrode 61 in a plan view while having the gate insulation film 32 therebetween. Apart of the second source electrode 62 is disposed on the oxide semiconductor film 33 and connected to the oxide semiconductor film 33. A part of the second drain electrode 63 is disposed on the oxide semiconductor film 33 and connected to the oxide semiconductor film 33 so as to be spaced from the second source electrode 62. A section of the oxide semiconductor film 33 between the connection section connected to the second source electrode 62 and the connection section connected to the second drain electrode 63 is the second channel section 64. A dimension, a shape, and arrangement of the components of the display area TFT 60 are not limited to those in FIG. 3 but may be altered as appropriate.

The display area TFT 60 is connected to the gate lines 58, the source lines 59 and also to the pixel electrode 55 through a contact hole formed in the organic insulation film 35. The display area TFT 60 is driven based on a scan signal transmitted through the gate lines 58 and an image signal transferred to the source lines 59 through the second channel section 64 of the display area TFT 60 is supplied to the pixel electrode 55 such that the pixel electrode 55 is charged at a certain potential.

As illustrated in FIG. 4, a column control circuit (a source driver driving circuit) 81 is arranged on a front surface side of the non-display area NAA of the array substrate 30 in adjacent to a short-side section of the display area AA. A row control circuit (a gate driver driving circuit) 82 is arranged on the front surface side of the non-display area NAA in adjacent to a long-side section of the display area AA. The column control circuit 81 and the row control circuit 82 are configured to control supply of output signals from the driving circuit 80 mounted on the driver 51 to the display area TFTs 60. The column control circuit 81 and the row control circuit 82 are mounted on the array substrate 30 in a monolithic manner using the oxide semiconductor film 33, the first metal film 31, and the second metal film 34 as a base. As illustrated in FIG. 4, the column control circuit 81 and the row control circuit 82 are mounted in the non-display area NAA closer to a middle section or the display area AA than the sealing member. The sealing member 45 is illustrated with a chain line in FIG. 1 and illustrated with a two-dot chain line in FIG. 4. The column control circuit 81 and the row control circuit 82 are formed with patterning on the array substrate 30 in the known photolithography method simultaneously with forming the display area TFTs 60 with pattering in the process of producing the array substrate 30.

As illustrated in FIG. 4, the column control circuit 81 is arranged next to the lower short-side section of the display area AA or arranged between the display area AA and the driver 51 in the Y-axis direction. The column control circuit 81 is mounted in a substantially laterally elongated square range extending in the X-axis direction. The column control circuit 81 is connected to the source lines 59 mounted in the display area and includes a switching circuit (a RGB switching circuit) that distributes image signals included in the output signals from the driver 51 to the respective source lines 59. Specifically, the source lines 59 are arranged parallel in the X-axis direction in the display area AA of the array substrate 30 and connected to the respective display area TFTs 60 forming the display pixels of each of colors of red (R), green (G), and blue (B). The column control circuit 81 distributes the image signals from the driver 51 to the respective source lines 59 of R, G, and B by the switching circuit. The column control circuit 81 may include an auxiliary circuit such as a level shifter circuit or an ESD protection circuit.

As illustrated in FIG. 4, the row control circuit 82 is arranged next to the left long-side section of the display area AA and is mounted in a substantially vertically elongated square range extending in the Y-axis direction. The row control circuit 82 is connected to the gate lines 58 mounted in the display area AA and includes a scanning circuit configured to supply scanning signals included in the output signals from the driver 51 to the respective gate lines 58 at a certain timing and scan sequentially the gate lines 58. Specifically, the gate lines 58 are arranged parallel in the Y-axis direction in the display area AA of the array substrate 30. The row control circuit 82 is configured to supply the control signals (the scanning signals) from the driver 51 through the scanning circuit sequentially to the gate lines 58 from an upper end one to a lower end one of the gate liens 58 in the display area AA in FIG. 4. Thus, the row control circuit 82 scans the gate lines 58. The column control circuit 81 and the row control circuit 82 are connected to the driver 51 through connection lines formed on the array substrate 30.

The scanning circuit included in the row control circuit 82 includes a buffer circuit that is connected to the gate lines 58 and amplifies the scanning signals and outputs them to the gate lines 58. The row control circuit 82 may include an auxiliary circuit such as a level shifter circuit or an ESD protection circuit. Each of such circuits included in the row control circuit 82 includes the non-display area TFT (one example of a first transistor) 70 illustrated in FIG. 3. The non-display area TFT 70 is arranged in the non-display area NAA of a plate surface of the array substrate 30 and formed simultaneously with the display area TFT 60 in the process of producing the array substrate 30. The non-display area TFT 70, for example, outputs a scan signal in a final step in signal processing that is performed in the scanning circuit and a current amount flowing through the non-display area TFT 70 is greater than a current amount flowing through the display area TFT 60.

As illustrated in FIG. 3, the non-display area TFT 70 includes the components same as those of the display area TFT 60. Namely, the non-display area TFT 70 includes the first gate electrode 71 formed from the first metal film 31, the oxide semiconductor film 33, the first source electrode 72, and the first drain electrode 73. The oxide semiconductor film 33 is disposed on an upper side of the first gate electrode 71 such that at least a part thereof overlaps the first gate electrode 71 while having the gate insulation film 32 therebetween in a plan view. At least a part of the first source electrode 72 is disposed on the oxide semiconductor film 33 and connected to the oxide semiconductor film 33. At least a part of the first drain electrode 73 is disposed on the oxide semiconductor film 33 so as to be spaced from the first source electrode 72 and connected to the oxide semiconductor film 33. A section of the oxide semiconductor film 33 between the connection section connected to the first source electrode 72 and the connection section connected to the first drain electrode 73 is the first channel section 74. The first channel section 74 formed from the oxide semiconductor film 33 extends in the X-axis direction from the first source electrode 72 to the first drain electrode 73 such that electrons can move between the electrodes 72, 73. The first source electrode 72 and the first drain electrode 73 are opposite each other while having a certain space therebetween in the extending direction (the X-axis direction) of the first channel section 74. Similarly to the display area TFT 60, a dimension, a shape, and arrangement of the components of the non-display area TFT 70 are not limited to those in FIG. 3 but may be altered as appropriate.

As described before, the non-display area TFT 70 and the display area TFT 60 are inverted staggered type TFTs and includes the oxide semiconductor film 33 as the activating layer and the channel sections 74, 64 that are disposed above the gate electrodes 71, 61, which are included in the lowest layer, respectively, while having the gate insulation film 32 therebetween. Since the components of the non-display area TFT 70 are arranged similarly to those of the display area TFT 60 are, the yield is preferably improved.

Next, a configuration of the CF substrate 20 will be described.

As illustrated in FIG. 2, color filters 21 of three colors of red (R), green (G), and blue (B) are formed on the inner surface side (a liquid crystal layer 40 side, a surface opposite the array substrate 30) of the CF substrate 20 in the display area AA. The color filters 21 of different colors are arranged in the X-axis direction and the color filters 21 of the same color are arranged in the Y-axis direction so as to be arranged in a matrix as a whole. Each of the color filters 21 overlaps each pixel electrode 55 on the array substrate 30 side in a plan view. In the liquid crystal panel 10 of the first embodiment, the color filters 21 of R, G and B that are arranged in the X-axis direction and three pixel electrodes 55 opposed to the color filters 21 form a pixel that is a display unit. A pixel in-between light blocking section 22A having a grid shape and formed from a light blocking film (a black matrix) 22 that blocks visible light from transmitting therethrough is formed between the adjacent color filters 21. The pixel in-between light blocking section 22A prevents the light traveling between the adjacent pixels and ensures independency of gradation. Particularly, a section of the pixel in-between light blocking section 22A extending in the Y-axis direction prevents the color mixture of different colors of the pixels. The pixel in-between light blocking section 22A is arranged to overlap the gate lines 58 and the source lines 59 in a plan view and covers the front surface side of the display area TFT 60 that is disposed at the intersection of the lines 58, 59. In the display area AA, the pixel in-between light blocking section 22A having a grid shape and overlapping the gate lines and the source lines is formed. In the non-display area NAA, a surrounding light blocking section 22B is formed in a solid manner in the non-display area NAA. The light blocking film 22 may be formed from metal material but may be preferably formed from resin material in view of restricting multi-reflection of external light.

As illustrated in FIG. 2, a counter electrode 25 is formed on surfaces (liquid crystal layer 40 side surfaces) of the color filters 21 and the pixel in-between light blocking section 22A. The counter electrode 25 is formed in a solid pattern over a substantially entire area of an inner surface of the CF substrate 20. The counter electrode 25 is formed from the transparent electrode material such as indium tin oxide (ITO) or zinc oxide (ZnO) similar to the pixel electrode 55. The counter electrode 25 is always held at a certain reference potential. Therefore, if a potential is supplied to each of the pixel electrodes 44 connected to each of the display area TFTs 60 according to driving of each display area TFT 60, potential difference is created between the counter electrode 25 and each of the pixel electrodes 55. According to the potential difference created between the counter electrode 25 and each of the pixel electrodes 55, the orientation of the liquid crystal molecules in the liquid crystal layer 40 changes. Accordingly, polarization of the transmission light also changes and the amount of transmission light of the liquid crystal panel 10 is controlled for each pixel independently and thus, a certain color image is displayed. A spacer may be disposed on the surface of the counter electrode 25 to keep a space between the substrates 20, 30 or a thickness (a cell gap) of the liquid crystal layer 40.

As illustrated in FIG. 3, the surrounding light blocking section 22B formed from the light blocking film 22 is disposed on the inner surface of the CF substrate 20 in the non-display area NAA. The counter electrode 25 is disposed on the surface (a liquid crystal layer 40 side surface) of the surrounding light blocking film 22.

As illustrated in FIG. 3, the surrounding light blocking section 22B of the first embodiment has a hole 22H. The hole 22H preferably has an opening area overlapping the non-display area TFT 70 in a plan view or overlap at least the first channel section 74. In the liquid crystal panel 10 of the first embodiment, since the surrounding light blocking section 22B has the hole 22H, the visible light from the front surface side of the liquid crystal panel 10 passes through the hole 22H and reaches the array substrate 30 and supplied to and absorbed by the oxide semiconductor film 33 of the non-display area TFT 70.

Next, operations of the display area TFT 60 and the non-display area TFT 70 included in the liquid crystal panel 10 and configured as described above will be described.

The input signals supplied from the control circuit board 52, which is the signal supply source, to the driver 51 through the flexible printed board 53 are processed through the driving circuit 80 of the driver 51 and output to the column control circuit 81 and the row control circuit 82 as output signals. The scan signals among the output signals are amplified by the scanning circuit of the row control circuit 82 and supplied to each of the gate lines 58 at a certain timing to scan the gate lines 58 sequentially. Accordingly, predetermined gate voltage is periodically applied to the second gate electrode 61 of the display area TFT 60. At this time, the predetermined gate voltage is periodically applied to the buffer circuit or the level shifter circuit included in the scanning circuit of the row control circuit 82 and the first gate electrode 71 of the non-display area TFT 70 that is included in the ESD protection circuit. The image signals among the output signals output from the driver 51 are distributed to the source lines 59 by the switching circuit of the column control circuit 81 and transmitted to the second source electrode 62.

The gate voltages applied to the gate electrodes 61, 71 are controlled to have different volumes (applied voltage) and timings (a voltage applying time) according to the function of the display area TFT 60 and the non-display area TFT 70. Specifically, the gate voltage of the display area TFTs 60 is relatively low in general and maintained at a third voltage that is a minus voltage. A fourth voltage, which is relatively high, is applied to the second gate electrodes 61 sequentially for several thousandth seconds (1/several thousands seconds) to several tens of thousandth seconds (1/several tens of thousandth seconds). For example, the third voltage is −10V and the fourth voltage is +20V and voltage of +20V is applied to the second gate electrode maintained at −10V at timing rate of one second for a unit cycle of 60,000 seconds. In such a display area TFT 60, an addition value of an integration value of the third voltage and the third voltage application time for the unit cycle and an integration value of the fourth voltage and the fourth voltage application time for the unit cycle is a negative value ((−10V×59, 999/60, 000)+(+20V×1/60,000)=(−599,990V+20V)/60,000=−599, 970V/60,000).

The gate voltage of the non-display area TFT 70 that has a function of amplifying the output signal from the driver 51 is controlled such that higher voltage is applied to the TFT 70 for a longer time compared to the gate voltage of the display area TFT 60. In such a non-display area TFT 70, an addition value of an integration value of the first voltage and the first voltage application time for the unit cycle and an integration value of the second voltage and the second voltage application time for the unit cycle is a positive value ((0V×1/2)+(+30V×1/2)=+15V).

Next, influences of electric stress and light absorption on the electric characteristics of the TFT will be verified.

Figure 5A:
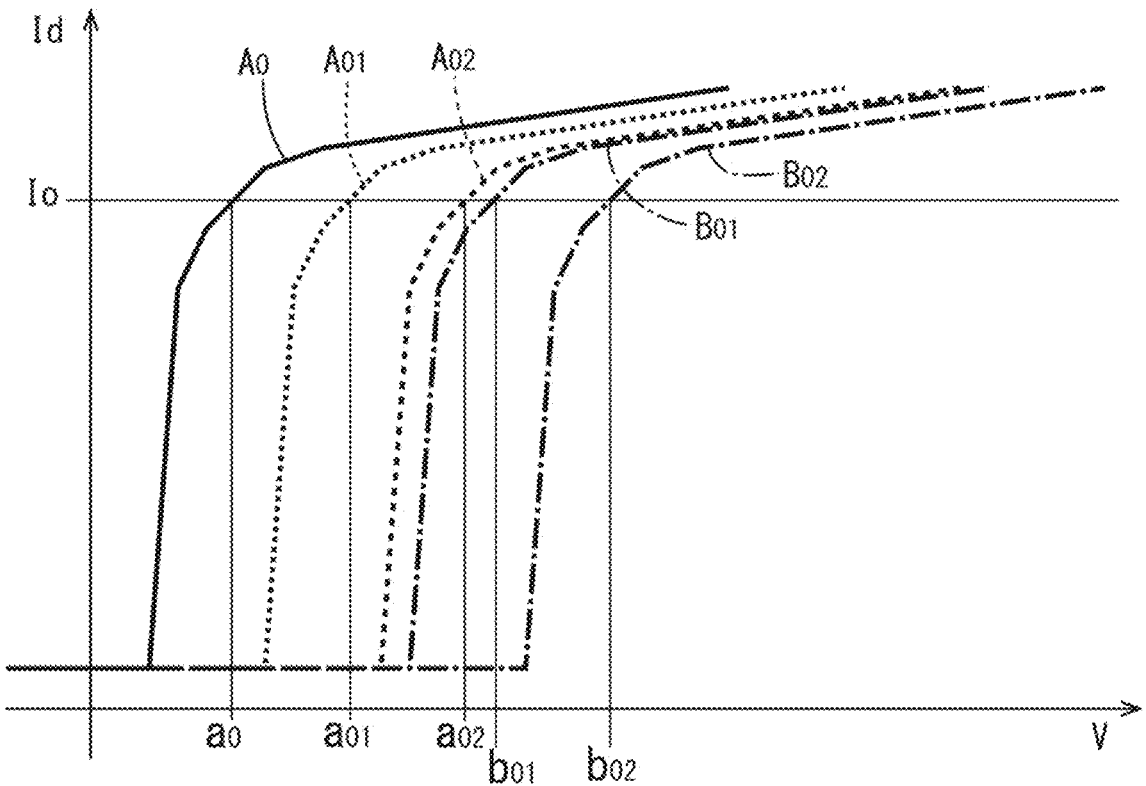
FIG. 5A is a graph representing change of electric characteristics of a TFT according to application of an electric stress (no light absorption).
Figure 5B:
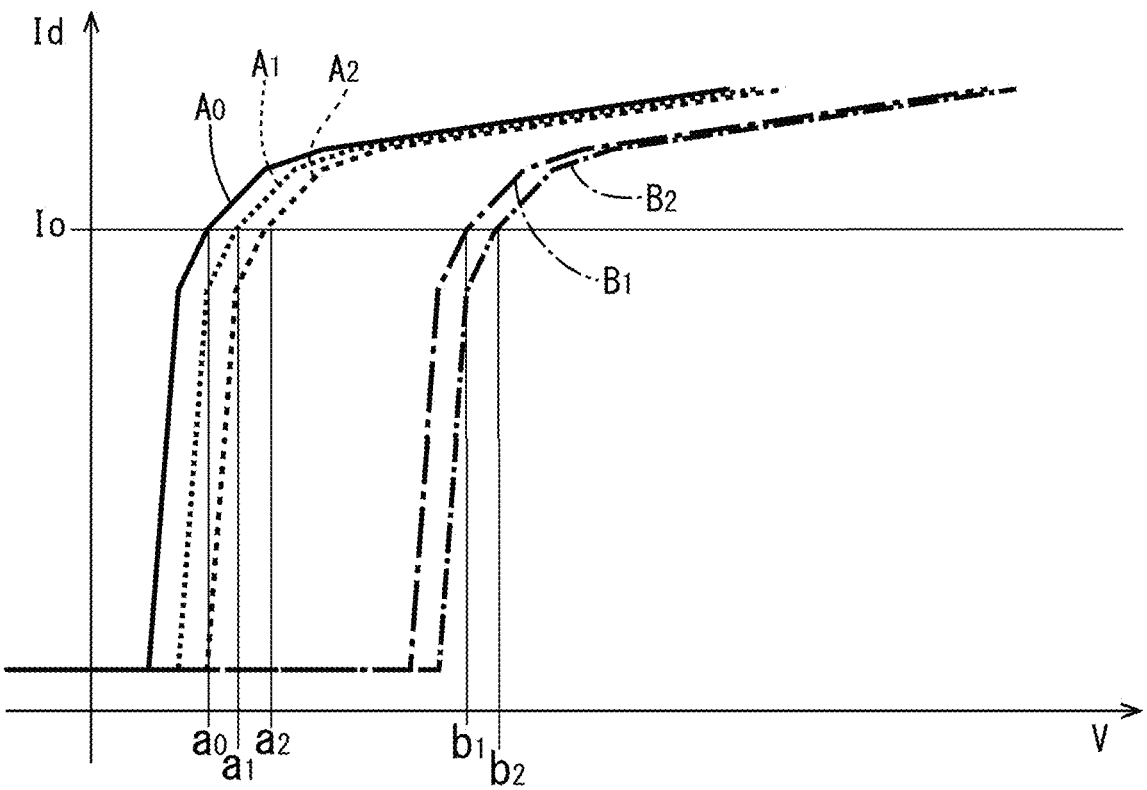
FIG. 5B is a graph representing change of electric characteristics of a TFT according to application of an electric stress (having light absorption).
Figure 6:
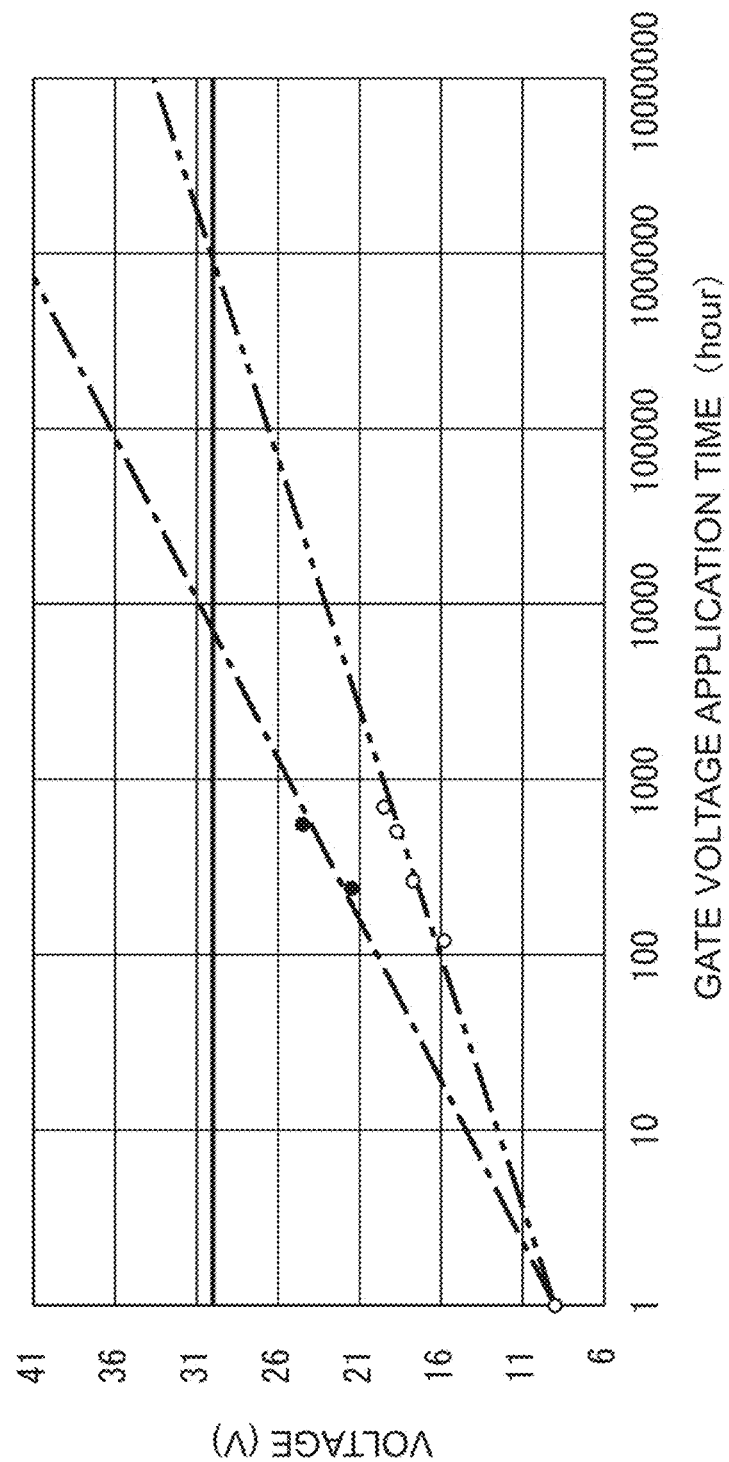
FIG. 6 is a graph representing change of voltages to keep a necessary current value $I_0$ according to application of an electric stress (dashed line: no light absorption, two-dot line: having light absorption).

In the TFTs including the oxide semiconductor film as the activating layer such as the TFTs 60, 70 of the first embodiment, the electric characteristics of the TFT are shifted according to the application of the voltage to the gate electrode and the electric characteristics are changed as a whole while receiving the electric stress periodically. Hereinafter, in a configuration that a verifying TFT including the oxide semiconductor film is used as the activating layer and the gate voltage is applied to the non-display area TFT 70 as described above, influences of the light absorption on the change of the electric characteristics will be verified with reference to FIGS. 5A, 5B and 6. FIGS. 5A and 5B generally illustrate change of current voltage characteristics of the verifying TFT. FIG. 5A illustrates the electric characteristics of the verifying TFT that does not absorb light. FIG. 5B illustrates the electric characteristics of the verifying TFT that absorbs light. FIG. 6 illustrates plotting of changes in the voltages (voltages that may cause lighting errors if the TFT is used for driving the liquid crystal panel) that cannot keep an effective amount of drain current Id (required current value $I_0$) if a first voltage and a second voltage are alternately and repeatedly applied to the gate electrode of the verifying TFT at a certain cycle. In FIG. 6, a dashed line illustrates the voltages in the verifying TFT that does not absorb light and a two-dot chain line illustrates the voltages in the verifying TFT that absorbs light.

Changes of the electric characteristics without having a light absorption property will be described with reference to FIG. 5A.

In an initial state that the gate electrode is provided with the first voltage (0V), the electric characteristics of the verifying TFT are represented by a line $A_0$ in FIG. 5A. If a value of the drain current Id required for normal control is a required current value $I_0$, required voltage $V_0$ required for keeping the required current value $I_0$ is represented by voltage $a_0$ in the drawing.

If the second voltage (+30V) is applied to the gate electrode at a certain timing, the electric characteristics of the verifying TFT are shifted in a plus direction by a certain amount from $A_0$ in FIG. 5A and are illustrated with the dashed line $B_{01}$. The required voltage $V_0$ at this situation is referred to as a voltage $b_{01}$.

Further, if the application voltage applied to the gate electrode is returned to the first voltage (0V) at a certain timing, the electric characteristics of the verifying TFT are shifted in a minus direction by a certain amount from $B_{01}$ in FIG. 5A and is illustrated with a dotted line $A_{01}$. In the TFT to which the gate voltage is applied with a method similar to the non-display area TFT 70, it has been known that the shift amount in the minus direction from $B_{01}$ to $A_{01}$ is smaller than the shift amount in the plus direction from $A_0$ to $B_{01}$ and $A_{01}$ appears on the plus side than $A_0$. If the required voltage $V_0$ in this state is defined as the voltage $a_{01}$, the voltage $a_{01}$ is greater than the voltage $a_0$ of the initial state as illustrated in the drawing. Namely, a formula of $|b_{01}-a_0|>|b_{01}-a_{01}|$ is satisfied.

Similarly, if the first voltage and the second voltage are subsequently applied to the gate electrode alternately and periodically, the electric characteristics of the verifying TFT are changed in the plus direction as a whole like $A_0 \to B_{01} \to A_{01} \to B_{02} \to A_{02} \to$ . . . . Accordingly, the required voltage $V_0$ is also changed in the plus direction like $a_0 \to a_{01} \to a_{02} \to$ . . . in the application of the first voltage and the required voltage $V_0$ is also changed in the plus direction like $b_{01} \to b_{02} \to$ . . . in the application of the second voltage.

Next, changes of the electric characteristics having light absorption will be described with reference to FIG. 5B in comparison to the above case without having the light absorption. The configuration of the verifying TFT and the method and conditions of applying voltage in FIG. 5B are same as those in FIG. 5A except for the light absorption property.

If the second voltage (+30V) is applied to the gate electrode at a certain timing in the initial state that the gate electrode is provided with the first voltage (0V) and the electric characteristics are represented by the line $A_0$, the electric characteristics of the verifying TFT are shifted in the plus direction by a certain amount from $A_0$ in FIG. 5B and are illustrated with the dashed line $B_1$. In the TFT including the oxide semiconductor film as the activating layer like the verifying TFT, the shift amount in the plus direction does not change even if the TFT absorbs light. Therefore, $B_1$ is same as $B_{01}$ without having the light absorption property and if the required voltage $V_0$ in this state is defined as the voltage $b_1$, the voltage $b_1$ is equal to the voltage $b_{01}$ in FIG. 5A.

Further, if the application voltage applied to the gate electrode is returned to the first voltage (0V) at a certain timing, the electric characteristics of the verifying TFT are shifted in the minus direction by a certain amount from $B_1$ in FIG. 5B and is illustrated with a dotted line $A_1$. The required voltage $V_0$ is defined as the voltage $a_1$. In the TFT including the oxide semiconductor film as the activating layer, it has been known that the shift amount in the minus direction is increased by absorbing light. FIG. 5B illustrates that the shift amount in the minus direction having the light absorption property is smaller than the shift amount in the plus direction and is extremely greater than the shift amount in the minus direction without having the light absorption property illustrated in FIG. 5A. As is clear from the comparison of FIG. 5B and FIG. 5A, the shift amount in the minus direction from $B_1$ to $A_1$ in FIG. 5B is greater than the shift amount in the minus direction from $B_{01}$ to $A_{01}$ in FIG. 5A and difference between the shift amount in the minus direction and that in the plus direction becomes extremely smaller. Therefore, a formula of $|b_1-a_0|=|b_{01}-a_0|>|b_1-a_1|>>|b_{01}-a_{01}|$ is satisfied, and a formula of $|a_1-a_0|<<|a_{01}-a_0|$ is satisfied.

Subsequently, if the first voltage and the second voltage are subsequently applied to the gate electrode alternately and periodically, the electric characteristics of the verifying TFT are changed in the plus direction as a whole like $A_0 \to B_1 \to A_1 \to B_2 \to A_2 \to$ . . . . The change amount is extremely reduced compared to that in FIG. 5A. As a result, the change of the required voltage $V_0$ in each of the first voltage application state and the second voltage application state becomes extremely smaller.

Next, the change of the electric characteristics without having the light absorbing property (the dashed line) and the change of the electric characteristics having the light absorbing property (the two-dot chain line) are compared with reference to FIG. 6. As is described with reference to FIG. 5A and FIG. 5B, if the verifying TFT is supplied with a certain gate voltage periodically, the electric characteristics are changed gradually in the plus direction. If the verifying TFT is provided with the similar electric stress (the periodical application of the gate electrode) and has the light absorbing property, the electric characteristics are less likely to be changed and the change amount is smaller compared to the case without having the light absorbing property. As is in FIG. 6, if the changes in the voltages that cannot keep a required current value Ioin the TFT are plotted with respect to the gate voltage application time (electric stress application time), a straight line (or a curved line) inclined right-upward is described. The changes with having the light absorbing property (the tow-dot chain line) are illustrated with a line inclined more gentle than that illustrating the changes without having the light absorbing property (the dashed line). FIG. 6 schematically illustrates the changes. For example, in the liquid crystal panel that is provided with a voltage of 30V to light on the pixels, if the TFT does not have the light absorbing property and is provided with the gate voltage continuously for about 10,000 hours, the required current value $I_0$ cannot be kept and a lighting error may be caused. If the TFT has the light absorbing property, the required current value $I_0$ can be kept until the voltage application time reaches about 1,000,000 hours. The TFT can function stably for a long time and display errors are less likely to be caused in the liquid crystal panel.

If the TFT including the oxide semiconductor film as the activating layer is used and the display area TFT 60 is provided with the gate voltage as described above, the shift amount of the electric characteristics in the minus direction is greater than that in the plus direction in the periodical application of binary gate electrodes. Therefore, even in the TFT having no light absorbing property, if the TFT is continuously provided with the gate voltage periodically, the electric characteristics are changed in the minus direction as a whole. In the TFT having the light absorbing property, the shift amount in the minus direction is increased as described above. Therefore, the change of the whole electric characteristics in the minus direction is amplified and driving of the TFT is further unstable.

As described before, the liquid crystal panel (one example of the display panel) 10 according to the first embodiment displays an image includes the array substrate (one example of the first substrate) 30, the CF substrate (one example of the second substrate) 20 that is disposed opposite the array substrate 30, the liquid crystal layer (one example of the electric optical substance) 40 that is sealed between the array substrate and the CF substrate, the TFT (one example of the transistor) disposed on the array substrate 30 and supplying an electric signal to the liquid crystal layer 40 and being the non-display area TFT 70 including the oxide semiconductor film 33 as the activating layer, and the surrounding light blocking section 22B disposed on the CF substrate 20 and formed from the light blocking film 22 that blocks transmission of visible light and having the hole 22H overlapping the non-display area TFT 70.

In the TFT including the oxide semiconductor film 33 as the activating layer, the electric characteristics are also changed by the absorption of light in addition to the electric stress. According to the configuration of the first embodiment, the gate voltage is applied (the electric stress is applied) to the non-display area TFT 70 so as to change the electric characteristics in a direction reverse to the change caused by the absorption of light and light is supplied to such a non-display area TFT 70 having the hole 22H in the light blocking film 22. This may cancel the change caused by the electric stress and the electric characteristics are less likely to be changed as a whole. As a result, the property of the non-display area TFT 70 is stabilized and the liquid crystal panel 10 having less occurrence of display errors is obtained.

In the liquid crystal panel 10 according to the first embodiment, the non-display area TFT 70 includes the first gate electrode 71 a part of which overlaps the oxide semiconductor film 33 in a plan view, the first source electrode 72 a part of which is disposed above the oxide semiconductor film 33 and connected to the oxide semiconductor film 33, and the first drain electrode 73 a part of which is disposed above the oxide semiconductor film 33 and connected to the oxide semiconductor film 33 while having a space from the first source electrode 72, and the first gate electrode 71 is supplied with the first voltage (0V) and the second voltage (+30V) that is higher than the first voltage periodically and alternately and the non-display area TFT (one example of the first transistor) 70 is controlled such that an addition value of an integration value of the first voltage and the first voltage application time for the unit cycle and an integration value of the second voltage and the second voltage application time for the unit cycle is a positive value.

In the non-display area TFT 70 that is controlled as described above, the electric characteristics are shifted in the plus direction according to the application of the second voltage, and the electric characteristics are shifted in the minus direction according to the application of the first voltage. The shift amount in the minus direction is smaller than the shift amount in the plus direction. Therefore, the electric characteristics are changed in the plus direction as a whole according to the gate voltage (the electric stress) that is alternately applied to the first gate electrode 71. If such a non-display area TFT 70 absorbs light, it is known that the shift amount in the minus direction is increased compared to the TFT that does not absorb light. According to the configuration of the first embodiment, the light passing through the hole 22H formed in the light blocking film 22 is absorbed by the non-display area TFT 70 to increase the shift amount in the minus direction such that the electric characteristics are less likely to be changed in the plus direction as a whole.

In the liquid crystal panel 10 according to the first embodiment, the hole 22H of the light blocking film 22 is formed to overlap at least the first channel section 74, in a plan view, that is formed between the connection section of the oxide semiconductor film 33 connected to the first source electrode 72 and the connection section thereof connected to the first drain electrode 73.

The electric characteristics are less likely to be changed by the light absorption because the light is supplied to and absorbed by the oxide semiconductor film 33 included in the non-display area TFT 70. According to the configuration of the first embodiment, the light is supplied to the first channel section 74 that is included in the non-display area TFT 70 and formed from the oxide semiconductor film 33 while suppressing the area of the hole 22H formed in the light blocking film 22. Accordingly, the electric characteristics are less likely to be changed.

In the liquid crystal panel 10 according to the first embodiment, the liquid crystal panel 10 is defined into the display area AA displaying an image according to an electric signal and the non-display area NAA not displaying an image, the non-display area TFT 70 is disposed in the non-display area NAA of the array substrate 30, and the surrounding light blocking section 22B formed from the light blocking film 22 is disposed in the non-display area NAA of the CF substrate 20.

In the non-display area TFT 70 of the row control circuit (a gate driver monolithic driving circuit, a GDM circuit) 82 that is arranged in a monolithic manner in the non-display area NAA, control of changing the electric characteristics in the plus direction is generally performed and for example, each of the gate voltages of 0V and +30V is applied to the TFT for a same interval time. Since the non-display area NAA is normally covered with the surrounding light blocking section 22B, the non-display area TFT 70 disposed in the non-display area rarely receives light. The present technology is particularly effective for restricting change of the electric characteristics of such a non-display area TFT 70.

The liquid crystal panel 10 according to the first embodiment further includes the display area TFT (one example of the second transistor) 60 disposed on the array substrate 30. The display area TFT 60 includes the oxide semiconductor film 33, the second gate electrode 61 a part of which overlaps the oxide semiconductor film 33 in a plan view, the second source electrode 62 a part of which is disposed on the oxide semiconductor film 33 and that is connected to the oxide semiconductor film 33, and the second drain electrode 63 a part of which is disposed on the oxide semiconductor film 33 and that is connected to the oxide semiconductor film 33 while having a space from the second source electrode 62. The third voltage (−10V) and the fourth voltage (+20V) that is higher than the third voltage is periodically and alternately applied to the second gate electrode 61 such that an addition value of an integration value of the third voltage and the third voltage application time for the unit cycle and an integration value of the fourth voltage and the fourth voltage application time for the unit cycle is a negative value, and the light blocking film 22 is formed to cover a section overlapping the display area TFT 60 in a plan view.

In the display area TFT 60 that is controlled as is in the first embodiment, the electric characteristics are shifted in the plus direction according to the application of the fourth voltage, and the electric characteristics are shifted in the minus direction according to the application of the third voltage. The shift amount in the minus direction is greater than the shift amount in the plus direction. Therefore, the electric characteristics are changed in the minus direction as a whole according to the gate voltage (the electric stress) that is alternately applied to the second gate electrode 61. If such a non-display area TFT 60 absorbs light, the shift amount in the minus direction is increased and the electric characteristics are more greatly changed compared to the TFT that does not absorb light. According to the configuration of the first embodiment, the light is supplied to the non-display area TFT 70 that is controlled such that the electric characteristics are changed in the plus direction, and the display area TFT 60 is covered with the light blocking film 22 not to supply the light to the display area TFT 60 that is controlled such that the electric characteristics are changed in the minus direction. Accordingly, the electric characteristics of the TFTs 60, 70 are less likely to be changed and display errors are much less likely to be caused.

In the liquid crystal panel 10 according to the first embodiment, the liquid crystal panel 10 is defined into the display area AA displaying an image according to an electric signal and the non-display area NAA not displaying an image, the display area TFT 60 is disposed in the display area AA of the array substrate 30.

For example, the TFT that is disposed in each of the pixels in the display area AA is generally controlled to change the electric characteristics in the minus direction as a whole by applying the voltage of +20V at a rate of several tens of thousandth seconds (1/several tens of thousands seconds) to the gate electrode supplied with the voltage of −10V. Such a display area TFT 60 is covered with the light blocking film 22 so as not to be supplied with light and accordingly, the electric characteristics are less likely to be largely changed.

The liquid crystal panel 10 according to the first embodiment further includes the liquid crystal layer 40 that is sealed between the array substrate 30 and the CF substrate 20, and the liquid crystal layer 40 is supplied with an electric signal to display an image.

According to the configuration of the first embodiment, the operation of various types of liquid crystal panels 10 that have been widely used is stabilized and display errors are less likely to be caused.

The liquid crystal display device (one example of the display device) 1 according to the first embodiment includes the liquid crystal panel 10 described above.

According to the configuration of the first embodiment, display errors are less likely to be caused in the display panels such as the liquid crystal panel 10 and an organic EL panel and the liquid crystal display device 1 having good display quality and high reliability is obtained.

<Second Embodiment>

A second embodiment will be described with reference to FIG. 7.

A liquid crystal panel 210 according to a second embodiment differs from the liquid crystal panel 10 according to the first embodiment in that a color filter 221 is disposed in a hole 222H of a surrounding light blocking section 222B of a CF substrate 220. Hereinafter, configurations, operations, and effects similar to those of the first embodiment will not be described. Configurations included in an array substrate 230 and the CF substrate 220 of the liquid crystal panel 210 according to the second embodiment will be described.

In the second embodiment, the CF substrate 220 does not include the counter electrode but includes a common electrode above the pixel electrode (on a liquid crystal layer 40 side) in the display area AA of the array substrate 230. Namely, an operation mode of the liquid crystal panel is not the VA mode as is in the liquid crystal panel 10 of the first embodiment and the liquid crystal panel 210 that is operated in the IPS mode such as a FFS mode will be described. Each of the components disposed in the display area AA of the array substrate 230 has a known configuration and does not influence the application of the present technology. Therefore, such components are not illustrated and will not be described in detail. As illustrated in FIG. 7, the non-display area TFT 70 similar to that of the first embodiment is disposed in the non-display area NAA of the array substrate 230 and will not be described.

As illustrated in FIG. 7, the CF substrate 220 of the second embodiment includes an overcoat film 223 on an inner surface thereof. The overcoat film 223 is made of organic material such as acrylic resin (such as PMMA) similarly to the organic insulation film 35 described in the first embodiment and configured to fill uneven surface created on a lower layer side thereof to be flat. The overcoat film 223 is disposed in a substantially solid manner over a substantially entire area extending from the display area AA to the non-display area NAA on an inner surface of the CF substrate 220 and disposed on an upper layer side (on the liquid crystal layer 40 side) of the color filter and the pixel in-between light blocking section in the display area AA.

The surrounding light blocking section 222B of the second embodiment has the hole 222H similar to the hole 22H of the surrounding light blocking section 22B of the first embodiment. The hole 222H is preferably formed to overlap the non-display area TFT 70 in a plan view and at least overlap the first channel section 74. As illustrated in FIG. 7, according to the second embodiment, the surrounding color filter 221B is fit within the hole 222H. The surrounding color filter 221B may be same as the color filter disposed in the display area AA; however, the surrounding color filter 221B may be preferably a color filter having high light transmittance in the short wavelength region and the surrounding color filter 221B of blue (B), for example, is disposed. The overcoat film 223 is formed on an upper layer side (on the liquid crystal layer 40 side) of the surrounding color filter 221B and the surrounding light blocking section 222B.

The liquid crystal panel 210 according to the second embodiment includes the color filter 221 disposed in a position overlapping the hole 222H of the light blocking film 222 of the CF substrate 220, and visible light of a predetermined wavelength is selectively transmitted through the color filter 221.

In the configuration of the light blocking film 222 having the hole 222H, the inner structure such as the non-display area TFT 70 is seen from the outside of liquid crystal panel 10 through the hole 222H and it may not be preferable. According to the above configuration, the inner structure of the liquid crystal panel 210 is less likely to be seen from the outside because of the color filter 221. In the first embodiment, the shift amount of the electric characteristics in the minus direction is increased in the TFT including the oxide semiconductor film by the light absorption and such increase of the shift amount is recognized when the TFT receives the light having the visible light range of 400 nm to 800 nm and particularly effectively recognized when the TFT receives the light having the short wavelength range of 400 nm to 500 nm. Accordingly, the color filter 221 is preferably a blue color filter through which a large amount of visible light rays having the short wavelength range is transmitted.

<Other Embodiments>

The present technology is not limited to the embodiments, which have been described using the foregoing descriptions and the drawings. For example, embodiments described below are also included in the technical scope of the present technology.

(1) The method of controlling the TFT described in the above embodiments is an example and the application voltage and the voltage application time may be altered as appropriate within a range that can satisfy the condition described in claims. In the above embodiments, the non-display area TFT 70 is included in the row control circuit 82; however, it is not limited to such a configuration. The present technology may be applied to a TFT for supplying various kinds of electric signals as long as the TFT includes the oxide semiconductor as the activating layer.

(2) In the above embodiments, the liquid crystal panel includes the non-display area NAA that is formed in a frame shape surrounding the display area AA; however, it is not limited to such a configuration. For example, the present technology may be applied to a display panel including a non-display area NAA within a display area AA. The arrangement and the configuration of the column control circuit and the row control circuit that may include the non-display area TFT may be altered as appropriate.

(3) The operation mode of the liquid crystal panel, which is an example of the display panels, is not particularly limited to one but may be various kinds of modes. Further, the display panel is not limited to the transmissive-type liquid crystal panel described in each of the above embodiments but may be a reflection-type liquid crystal panel or other types of display panels (e.g., organic EL panels, plasma display panels (PDPs), electrophoretic display panels (EPD), and micro electro mechanical system (MEMS) display panels).

The invention claimed is:
1. A display panel comprising:
a display area that displays an image according to an electric signal and a non-display area that does not display any image;
a first substrate;
a second substrate disposed opposite the first substrate;
an electric optical substance sealed between the first substrate and the second substrate;
transistors on the first substrate and supplying the electric signal to the electric optical substance, the transistors including display area transistors in the display area and non-display area transistors in the non-display area, each of the non-display area transistors including:
an oxide semiconductor film as an activating layer;
a first source electrode, a portion of which is above the oxide semiconductor film and connected to the oxide semiconductor film;
a first drain electrode, a portion of which is above the oxide semiconductor film and connected to the oxide semiconductor film while being spaced from the first source electrode; and
a first channel section that is a portion of the oxide semiconductor film between a connection section of the oxide semiconductor film connected to the first source electrode and a connection section of the oxide semiconductor film connected to the first drain electrode; and
a light blocking film provided in a matrix on the second substrate in the display area and in a solid manner in the non-display area, and blocking visible light from transmitting therethrough, the light blocking film in the non-display area including a hole in a position overlapping each of the non-display area transistors in a plan view, the hole including an opening area overlapping an entire area of the first channel section.

2. The display panel according to claim 1, wherein
each of the non-display area transistors further includes a first gate electrode, a portion of which overlaps the oxide semiconductor film in the plan view; and
the first gate electrode is supplied with a first voltage and a second voltage that is higher than the first voltage periodically and alternately, and the first transistor is controlled such that an addition value of an integration value of the first voltage and first voltage application time for a unit cycle and an integration value of the second voltage and second voltage application time for the unit cycle is a positive value.

3. The display panel according to claim 1, further comprising a color filter that is disposed in a position overlapping the hole of the light blocking film of the second substrate and through which visible light of a predetermined wavelength is selectively transmitted.

4. The display panel according to claim 1, wherein each of the display-area transistors includes:
an oxide semiconductor film;
a second gate electrode, a portion of which overlaps the oxide semiconductor film in the plan view;
a second source electrode, a portion of which is disposed on the oxide semiconductor film and that is connected to the oxide semiconductor film; and
a second drain electrode, a portion of which is disposed on the oxide semiconductor film and that is connected to the oxide semiconductor film while being spaced from the second source electrode, wherein
a third voltage and a fourth voltage, which is higher than the third voltage, is periodically and alternately applied to the second gate electrode such that an addition value of an integration value of the third voltage and third voltage application time for a unit cycle and an integration value of the fourth voltage and fourth voltage application time for the unit cycle is a negative value, and the light blocking film covers a section overlapping the second transistor in the plan view.

5. The display panel according to claim 1, further comprising a liquid crystal layer including the electric optical substance sealed between the first substrate and the second substrate, wherein the liquid crystal layer is supplied with the electric signal such that the image is displayed.

6. A display device comprising the display panel according to claim 1.

7. The display device according to claim 1, further comprising a counter electrode provided in a solid manner between the light blocking film and the electric optical substance, the counter electrode being located in both the display area and the non-display area.

8. The display device according to claim 1, further comprising a control circuit provided in the non-display area and including the non-display area transistors.

* * * * *